(12) United States Patent
Sousa et al.

(10) Patent No.: US 6,810,054 B2
(45) Date of Patent: Oct. 26, 2004

(54) MODE-LIMITING DIODE LASER STRUCTURE

(75) Inventors: John Gary Sousa, Hollis, NH (US); Steven Stoltz, Nashua, NH (US)

(73) Assignee: Presstek, Inc., Hudson, NH (US)

( * ) Notice: Subject to any disclaimer, the term of this patent is extended or adjusted under 35 U.S.C. 154(b) by 80 days.

(21) Appl. No.: 09/822,045

(22) Filed: Mar. 30, 2001

(65) Prior Publication Data

US 2002/0085604 A1 Jul. 4, 2002

Related U.S. Application Data

(60) Provisional application No. 60/193,751, filed on Mar. 31, 2000.

(51) Int. Cl.[7] .................................................. H01S 5/00
(52) U.S. Cl. .......................................... 372/45; 372/46
(58) Field of Search .............................. 372/18, 45, 46

(56) References Cited

U.S. PATENT DOCUMENTS

| | | | | |
|---|---|---|---|---|
| 4,965,525 A | * | 10/1990 | Zah ............................. | 359/344 |
| 5,321,718 A | * | 6/1994 | Waarts et al. ............... | 372/108 |
| 5,337,328 A | * | 8/1994 | Lang et al. .................. | 372/45 |
| 5,539,571 A | * | 7/1996 | Welch et al. ................ | 359/344 |
| 5,657,339 A | * | 8/1997 | Fukunaga .................... | 372/50 |
| 5,936,991 A | * | 8/1999 | Lang et al. .................. | 372/50 |
| 6,014,396 A | * | 1/2000 | Osinski et al. ............... | 372/45 |
| 6,169,757 B1 | * | 1/2001 | Merritt ........................ | 372/50 |
| 6,307,873 B1 | * | 10/2001 | Geels et al. .................. | 372/45 |
| 6,375,364 B1 | * | 4/2002 | Wu .............................. | 372/50 |

* cited by examiner

Primary Examiner—Don Wong
Assistant Examiner—Cornelius H. Jackson
(74) Attorney, Agent, or Firm—Testa, Hurwitz & Thibeault, LLP

(57) ABSTRACT

A laser-diode structure whose output is largely single-mode utilizes a ridged top layer that defines an amplification region within an underlying emission layer, and which is provided with grooves that suppress the higher modes.

8 Claims, 2 Drawing Sheets

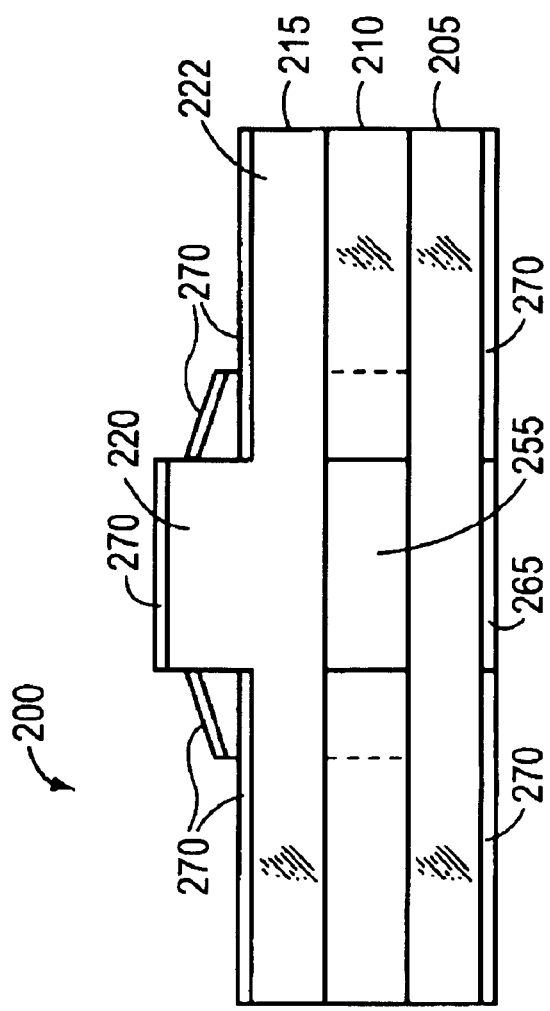
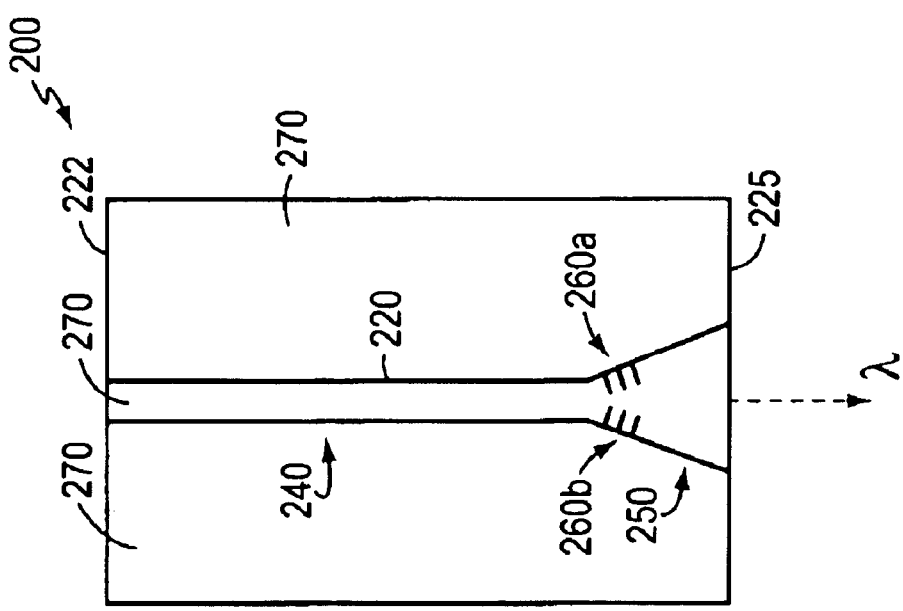
FIG. 2B
FIG. 2A

MODE-LIMITING DIODE LASER STRUCTURE

RELATED APPLICATION

This application claims the benefits of U.S. Provisional Application Ser. No. 60/193,751, filed on Mar. 31, 2000.

FIELD OF THE INVENTION

The present invention relates to diode laser devices.

BACKGROUND OF THE INVENTION

A laser is a device that produces monochromatic, coherent light through stimulated emission of photons from the atoms or molecules of a lasing medium, which have been excited from the ground state to a higher energy level. For example, the lasing material may be a rare-earth element (e.g., a lanthanide such as Nd or Er) dispersed as a dopant within a carrier. The laser medium is part of an optical cavity or resonator defined by highly reflective surfaces; these reflect light back and forth through the medium to stimulate emission. More specifically, if an energy-level population inversion is created by excitation of the laser medium, the spontaneous emission of a photon from an excited atom or molecule returning to its ground state can stimulate the emission of photons of identical energy from other excited atoms or molecules. The initial photon thereby generates a cascade of photons that have identical energy and are exactly in phase, and this cascade effect is multiplied as the photons travel repeatedly between the mirrors. The mirrors do not have perfect reflectivities, however, allowing a portion of this cascade to exit the cavity and thereby provide a laser output.

Excitation of the lasing medium can be accomplished in any of a variety of ways, including optical pumping, current injection, or the use of an electrical discharge. A diode semiconductor laser utilizes current injection, and such a laser is typically fabricated initially from an intrinsic semiconductor heterostructure grown on a substrate. The final p-i-n structure for a laser diode, which is obtained by adding n and p doping stripes to the top and bottom portions of the structure, differs from an ordinary p-n junction in containing an intervening intrinsic layer consisting of either a single quantum well (SQW) or multiple quantum wells (MQWs). A widely studied quantum well system consists of alternating layers of GaAs and $Al_{1-x}Ga_xAs$. In this system, the energy difference between the unfilled conduction band edge and the filled valence band edge of GaAs, referred to as its "bulk energy gap," is smaller than the corresponding gap in $Al_{1-x}Ga_xAs$. Since 60% of the difference between the two bulk energy gaps at the heterojunctions of this system is accomodated by the conduction band, with the remaining 40% accommodated by the valence band, the conduction and valence band wells occur in the same layer of the GaAs structure.

At T=0° K, no electrons populate the conduction band of a laser diode heterostructure. As the temperature is raised, a fixed number of electrons in thermal equilibrium with the lattice are excited across the T=0° K energy gap. The conduction band then becomes partially filled through a wide range of energies according to a Fermi distribution. As more electrons continue to be promoted across the gap with increasing temperature, states near the conduction and valence band edges gradually become filled and unavailable for photon absorption, and the majority of the absorption is shifted to higher energies. Absorption at the T=0° K gap, on the other hand, is totally suppressed when a non-equilibrium concentration of charge carriers is injected into the wells so as to completely fill the band edges up to some quasi-Fermi level. The new effective energy gap that results, ΔF, is the difference between the quasi-Fermi level in the conduction band ($F_c$) minus the quasi-Fermi level in the valence band ($F_v$).

The T=10° K energy gap of a quantum well can itself be increased relative to the energy gap of the bulk material by reducing the thickness of the quantum well. The reason for this is simply that the quantum-mechanical effect of the discontinuity in the band edge is such as to admit only discrete sub-band states within the well, and each sub-band has associated with it a different confinement energy relative to the zero-point energy at the bottom of the well. Other factors affect the energy position of band edge recombination (and the absorption spectrum of the material); these include band-gap renormalization (shrinkage of the energy gap) due to carrier-carrier interactions at high carrier concentration, and temperature.

As explained above, to achieve lasing in any structure, optical feedback must be provided (via mirrors) through a gain medium. In a semiconductor laser diode, the expression for the gain coefficient, g(v), for a laser of this type at a given frequency v is given by $\alpha(e^{(\Delta F-h\nu)/kT}-1)$. From the condition that $\Delta F > h\nu > E_{gap}$ (where $E_{gap}$ is the T=10° K energy gap at thermal equilibrium), lasing cannot occur in a region of the crystal without the injection of a non-equilibrium concentration of carriers into that region. Typically, the cleaved output facets of a semiconductor crystal serve as the mirrors.

Laser diodes generally fall into two categories: "gain-guided" structures and "index-guided" structures. The present invention is concerned with the latter. For both types of structures, output light generated from electron-hole recombination in the quantum well is optically confined in the plane of the well layer, since this layer generally has a higher refractive index than the adjacent barrier layer. A crude rule of thumb illustrating this point is the so-called Moss rule, which states that $n^4 E_{gap}=77$. In index-guided structures, refractive index differences are also introduced within the plane of the quantum well, further confining the output light laterally within the active region near the region of the doping stripes. Thus, refractive-index differences confine the light both transversely (keeping it within the well layer) and laterally (affecting the distribution of light within the well layer).

In gain-guided structures, although the light is not strictly confined laterally under the doping stripe by differences in refractive index, any light escaping the active region is not amplified simply because the non-equilibrium carrier concentrations injected into the well by the doping stripe do not diffuse far from the active region before recombining.

One of the advantages a properly designed index-guided structure provides over gain-guided structures—an advantage utilized in this application—is the ability to confine the output light to a single lateral mode of the cavity. This results in output light that is diffraction-limited and can be focused to a desired spot size with a longer image distance. Consequently, a greater depth of focus near the image plane is achieved. On the other hand, index-guided structures that confine light to a single lateral output mode suffer from a serious drawback. Their cavity size is generally smaller than 10 μm, which restricts output power to levels that do not damage the output facets. (Output damage to the facets is caused by heating due to enhanced absorption at the facets, which is itself a result of band bending induced from high surface recombination at the facet.) Several strategies have been employed in the past to overcome this difficulty, including the use of larger cavities having curved output facets, non-absorbing mirror facets, and implementation of arrays of single-mode cavities that are weakly optically coupled and are designed to lase only in the fundamental mode of the coupled system. Each of these strategies is discussed below.

When curved output facets are used with a larger cavity, some of the less-collimated light originating from higher-order lateral modes of the cavity is reflected away from the optical axis and rejected before it can be fed back through the gain medium of the cavity. Light reflected back and forth n times by the curved mirror facets of an unstable resonator cavity acts as if it has passed straight through a system of n repeating diverging lenses. The optical-transfer matrix of any system of repeating lenses such as this is obtained by applying Sylvester's Theorem to the transfer matrix of one of the lens components. The transfer matrix of a single lens is, in turn, a function of its radius of curvature. The significance of the transfer matrix is that it links an input ray's lateral distance from the optical axis, $r_1$, and its angle of divergence, $r'_1$, to the analogous quantities $r_2$ and $r'_2$ of the output ray. Clearly, the output divergence of the system, $r'_2$, will be greater than the input divergence, $r'_1$, and increases with the number of reflections n (unless $r_1$ and $r'_1$ are both zero). Consequently, $r'_2$ must be kept within reasonable limits in a design that limits the number of passes (by controlling the reflectance of the output facets), and/or limits the divergence of the mirrors.

To understand the strategy of coupling the light output from a set of single-mode cavities together in the output, it is helpful to describe the lateral y component of the electric field, $E_y$ (x, y, z), in an injection laser with Maxwell's equation as $$[d^2{}_{3D} - (\kappa(x,y)/c^2)c^2/ct^2]E_y = 0$$

where $\kappa(x, y)$ describes the transverse and lateral variations of the dielectric constant. If we ignore the lateral (y-direction) variations in $\kappa(x, y)$ and assume that $E_y$ decouples according to the expression $E(x, y, z) = e^{j\beta c + i\alpha x}E(x)$, the following 1D equation results:

$$\frac{d^2 E_y}{dx^2} + [k_0^2 n^2(x) - \beta^2]E_y = 0$$

Here, $k_0 = \omega/c = 2\pi/\lambda$, $\beta$ is referred to as the propagation constant, and $n(x) = \sqrt{\kappa(x)}$ describes the index of refraction. The equation resembles Schrödinger's equation with the term $k_0^2 n^2(x)$ being analogous to a set of electrostatic potential wells and barriers in the x direction, and with $\beta^2$ being analogous to the "energy" of one of the states confined in a well. According to that analogy, the thickness of the confining "well layer" can be reduced, pushing up the "confinement energy" (just as in the case of the electron subband states in a quantum well) to the point at which only one confined state is trapped. So long as the "confining potentials" are constant in each region, the 1D problem can be solved exactly with transfer matrix methods.

When lateral variations of the index are introduced, the expression for the field is assumed to decouple into longitudinal (z), transverse (x), and lateral (y) components as:

$$E_y = u^m(x) v^m(y) e^{-\beta z}$$

Substituting this expression into Maxwell's equation yields the following 2D expression:

$$[c^2 u^m(x)/cx^2 v^m(y) + u^m(x) c^2 v^m(y)/cy^2 + \{\beta^2 + k_0^2 \kappa(x,y)\} u^m(x) v^m(y)] = 0$$

The above expression cannot be directly solved with transfer matrix methods as in the 1D case. This is because the solutions for the 1D equation in a layer m of the structure are of the form $E_y = A_m \sin(Q_m x) + B_m \cos(Q_m x)$ if m is a "well" layer or $E_y = A_m e^{Q_m x} + B_m e^{-Q_m x}$ if m is a "barrier" layer, where $Q_m = \sqrt{\text{abs}(k_0^2 n_{m^2(x)}^2 - \beta^2)}$. If one were to attempt to define $u = A_m \sin(Q_1 x) + B_m \cos(Q_1 x)$ and $v = C_m \sin(Q_2 y) + D_m \cos(Q_2 y)$, and substitute these into the 2D equation, the result is that $Q_1^2 + Q_2^2 = Q_m^2$ (i.e., that the values of $Q_1$ and $Q_2$ are not uniquely determined from the confining potentials $Q_m$).

An accurate way of dealing with this problem is known as the effective index approximation. This procedure exploits the fact that the variation in index along one lateral (y-axis) direction is much more gradual than that in the other direction; quantum well variations in the transverse (x-axis) direction repeat on length scales of 10–20 nm, whereas in index-guided structures, the additional lateral confinement direction is given by dimensions as large as 10 μm).

In the effective index approximation, one first assumes that the u(x) terms satisfy the 1D equation $$\frac{d^2 u}{dx^2} + [k_0^2 n^2(x, y) - a(y)^2]u = 0,$$

and thereupon solves this equation for an "effective index" a. This effective index, in turn, is used to solve for the propagation constant in the following equation for v(y)

$$\frac{d^2 v}{dy^2} + [a(y)^2 - \beta^2]v = 0$$

By applying the effective index approximation (or other methods of coupled-mode analysis) to an array of N weakly coupled emitter structures that individually have the required dimensions for single-mode behavior, N distinct supermodes of the array emerge. The field of a supermode can be thought of as a linear superposition of individual emitters each oscillating with a distinct phase shift relative to the other emitters of the array. It has been found that introducing optical gain in the regions between the elements of an array leads to the preferential excitation of the fundamental mode of the array.

As noted above, in order to accurately model the confined optical modes in a system, one must know the confining indices of refraction $n(x, y)$ for that region. In any given material, the index of refraction, n, is defined from plane-wave solutions of Maxwell's Equations as:

$$E = A e^{(ik(n_x x + n_y y + n_z z) - i\omega t)}$$

where $k^2 n^2 = \mu \epsilon (\omega^2/c^2)$, $\mu$ and $\omega$ being magnetic and electrostatic (dielectric) permittivity constants, respectively.

The plane-wave solution above describes how a medium responds to and propagates a driving electromagnetic field. Clearly, light absorption only occurs when the index of refraction has an imaginary component, because as can be seen from the plane-wave term above, if either $n_x$, $n_y$, or $n_z$ is imaginary, a negative term appears in the exponent (since $i^2 = -1$) and the propagating wave decays exponentially would be expected when there is absorption.

As one example, consider the case of an undoped semiconductor at low temperature that is driven at a photon frequency near its energy gap. The dielectric function, $\epsilon$, and hence the index of refraction, $n(x, y) = \sqrt{\epsilon}$ is given as:

$$\varepsilon(\omega) = \varepsilon_{inf} + \frac{\sum_n A_n}{\omega_n^2 - \omega^2 + i\gamma_n \omega}$$

In this model, the frequency response of the crystal's polarizability (described by the crystal's dielectric function) is given in terms of photon angular frequency ω, with ω near the band edges, and is modeled after a classical spring system having discrete natural resonances $\omega_n$ with damping constants $\gamma_n$, and oscillator strengths $A_n$. In undoped samples at low temperature the summation is over the discrete excitonic transition frequencies. In a doped sample at room temperature, the absorption spectrum is less discrete in energy since the excitons (i.e., bound electron hole molecules), are screened out by charge carriers and broadened by interactions with phonons.

At room temperature, the energy dependence of the imaginary component of the dielectric function can (as stated earlier) be obtained from the energy spectrum of the absorption coefficient. The energy spectrum of the absorption coefficient, α, is in turn obtained from the electron density of states at the energy gap, expressed as $2 \times 10^4 \sqrt{E-E_{gap}}$ cm$^{-1}$ for a bulk semiconductor, and the typical staircase function describing the sub-band density of states in a quantum well. (A more detailed model is required to include the effects of bandfilling in a doped sample.) Once the imaginary component of the dielectric function is known, the real portion can be obtained from it via a Kramer's Kronig analysis.

Another effect that alters the refractive index when carriers are injected into a quantum well is the dielectric response of the electron plasma. The dielectric response of electrons in a quantum well can actually be treated from the viewpoint of classical physics since the electrons are free to undergo intersub-band transitions in the well, and are not simply particles exhibiting the properties of a single sub-band state. The expression for the change in refractive index due to intersubband free carrier absorption in terms of the concentration of injected electrons, N, and holes, P, is:

$$\Delta n(\omega) = \frac{e^2 \lambda^2}{8\pi^2 n(\lambda) e_0 c^2} [N/m^e + P(m_{lh}^{1/2} + m_{hh}^{1/2})/(m_{lh}^{3/2} + m_{hh}^{3/2})]$$

where $m_{lh}$ and $m_{hh}$ are the effective masses of the light hole and heavy hole bands, respectively.

As shown in FIG. 1, an index-guided structure 100 includes a pair of AlAs layers 105, 110 and, sandwiched therebetween, a GaAs layer 115. Ordinarily these layers are created by epitaxial growth on a substrate, successively building up the layers in the y-axis direction. As noted above, differences in refractive index between the AlAs and GaAs layers confine amplified light along the y axis to the GaAs layer 115. As in the gain-guided structure, an n-type doping stripe 120 is applied to AlAs layer 105 and a p-type doping stripe (not shown) is applied to AlAs layer 110 directly opposite stripe 120.

In addition, a pair of metal contacts 125, 130 is applied to the top surface of layer 105, and a complementary pair of contacts (not shown) is applied to the bottom surface of layer 110. When the contacts are connected to a voltage source, the resulting electric field (indicated by arrows) alters the refractive indices of all three layers 105, 110, 115 in the solid rectangular regions 140, 145 defined by the contacts. As a result, amplified light is optically confined to the region 150, the front facet thereof representing the structure's emission aperture.

A persistent difficulty with lasers of this type is production of "multi-mode" output radiation. Particularly in imaging applications requiring maximum use of available laser power, it is desirable to operate with a single transverse output mode (preferably the lowest-order, fundamental TEM$_{00}$ mode), with the output divergence as close as possible to that of a diffraction-limited source. This condition produces a smooth, Gaussian energy profile in the output beam, whereas in multi-mode beams, the energy peaks at multiple "hot spots" across the beam cross-section.

DESCRIPTION OF THE INVENTION

BRIEF DESCRIPTION OF THE DRAWINGS

The foregoing discussion will be understood more readily from the following detailed description of the invention, when taken in conjunction with the accompanying drawings, in which:

FIGS. 2A and 2B are enlarged plan and end views, respectively, of a semiconductor laser structure in accordance with the present invention.

DETAILED DESCRIPTION OF THE PREFERRED EMBODIMENTS

Figure 1:
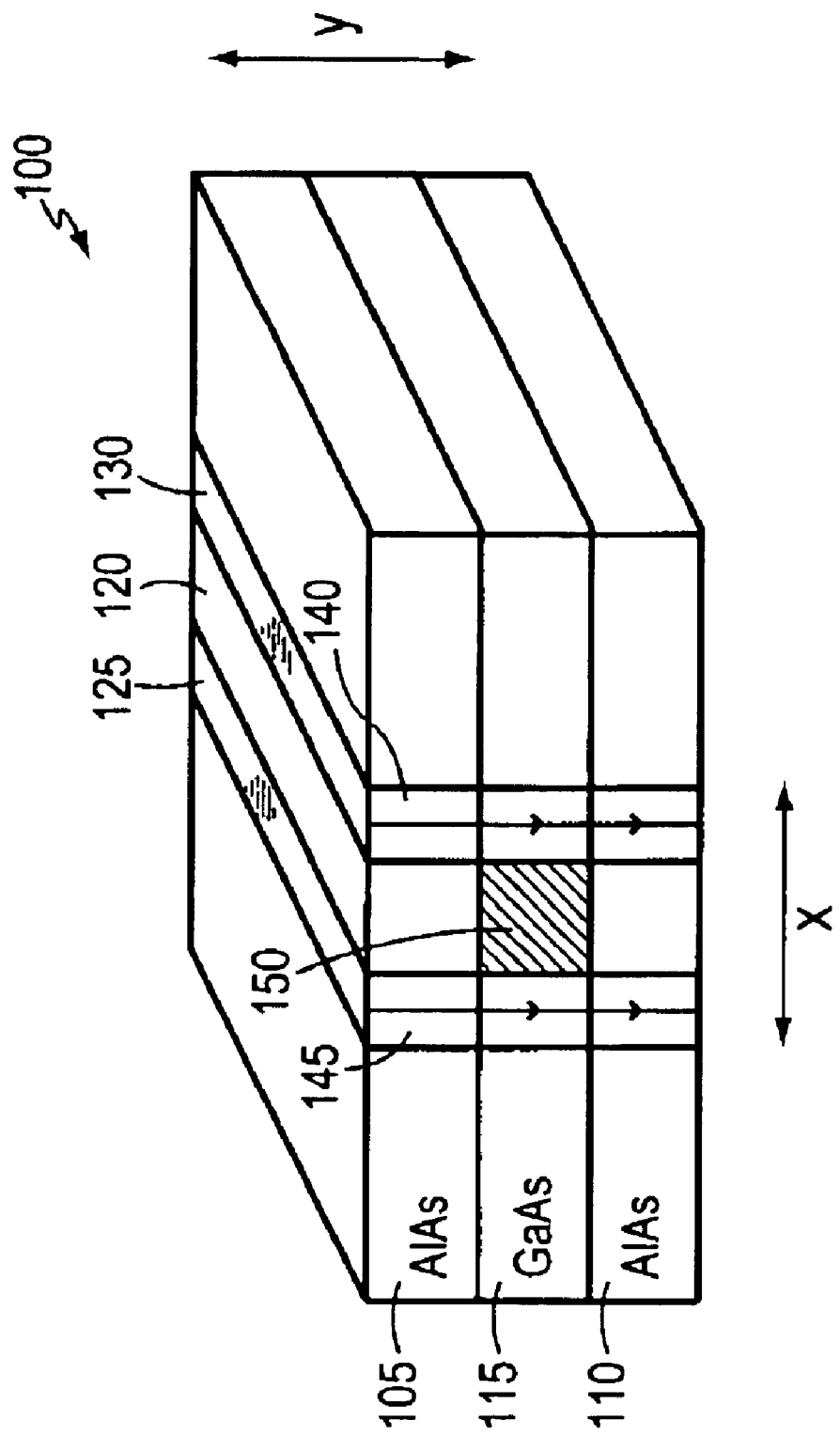
FIG. 1 is an enlarged isometric view of a prior-art index-guided semiconductor laser.

The present invention provides a laser-diode structure whose output is largely single-mode. This is achieved by using a ridged top layer that defines the amplification region within the underlying emission layer, and which is provided with grooves that suppress the higher modes. As shown in FIGS. 2A and 2B, a representative structure 200 includes a first, second, and third semiconductor layers 205, 210, 215, respectively, which form a diode laser as described above. The top layer 215 is provided with a ridge 220 that extends from the rear edge 222 of layer 215 to the front edge 225 thereof. The ridge has an elongated, narrow segment 240 and a flared segment 250 that terminates at the front edge 225. The ridge 220 also contains a doping material (e.g., a rare earth element as discussed above), and a complementary doping material 265 is applied to the bottom surface of layer 205 in a pattern identical to the shape of ridge 220, and in direct opposition thereto. The entire top surface of layer 215 (including the exposed surfaces of ridge 220) and the entire bottom surface of layer 205 are metallized to form electrical contacts 270.

The purpose of the ridge 220 is to define an amplification region within layer 210. When an electric field is created between the metallized surfaces, the induced change in the refractive indices of layers 205, 210, 215 is different within the region defined by ridge 220. Consequently, if the gain medium is limited to this region 255 within layer 210, amplified light generated therein will remain optically confined within that region. In effect, ridge 220 acts as a waveguide.

The width of ridge 220 governs the number of modes of light that can travel through the region 255. If segment 240 is narrow enough, only a single mode will be permitted to propagate. Unfortunately, it is not possible to maintain so narrow a dimension through the entire length of ridge 220, since this would result in an unacceptably high flux density at the output facet; it is for this reason that the ridge flares into segment 250, which produces an acceptable output power density. Without further measures, however, higher-order modes will emerge in the flared segment 250.

To suppress these higher-order modes, a series of grooves 260a, 260b are etched into the top surface of ridge 220 at the beginning of flared segment 250. These grooves extend from each side edge of flared segment 250 perpendicularly to that edge, and serve to alter the gain profile in a manner that "chops out" the higher-order modes. There may be, for example, 1, 3, or 5 pair of grooves. The grooves extend toward the center of segment 250 but opposed grooves do not meet.

What is claimed is:

1. A diode laser comprising:

a. a plurality of semiconductor layers including a top layer, a bottom layer, and an intermediate emission layer, the top layer including a ridge formed on a top surface thereof and extending to a first edge of the top layer, the layers each having a refractive index associated therewith, the refractive index of the emission layer differing from the refractive indices of the top and bottom layers;

b. a dopant region contained by the ridge;

c. means facilitating application of an electric field through the layers, the electric field altering the refractive indices of the layers, the degree of alteration differing within a confinement region defined by the ridge, radiation generated within the emission layer being optically confined within the confinement region and emitted from a first edge of the emission layer;

wherein d. the ridge comprises an elongated segment and a flared segment extending to the first edge, the flared segment comprising at least two opposed grooves in a surface thereof, the grooves suppressing only multimode radiation.

2. The diode laser of claim 1 further comprising a dopant material on an exposed surface of the bottom layer in a pattern identical in shape to the ridge.

3. The diode laser of claim 1 wherein the means facilitating application of an electric field is a pair of metal contacts on the top and bottom layers.

4. The diode laser of claim 1 wherein the ridge acts as a waveguide and the elongated segment has a width that permits only a single mode of light to propagate therethrough.

5. The diode laser of claim 1 wherein the flared segment has a pair of opposed side edges, the grooves extending from each side edge in a direction perpendicular to the edge.

6. The diode laser of claim 1 wherein the flared segment comprises a single pair of grooves.

7. The diode laser of claim 1 wherein the flared segment comprises three pairs of grooves.

8. The diode laser of claim 1 wherein the flared segment comprises five pairs of grooves.

* * * * *